United States Patent
Inoue et al.

(10) Patent No.: US 9,480,148 B2
(45) Date of Patent: Oct. 25, 2016

(54) METAL-CLAD LAMINATE AND PRINTED WIRING BOARD

(75) Inventors: Hiroharu Inoue, Osaka (JP); Shingo Yoshioka, Osaka (JP); Koji Kishino, Fukushima (JP); Takatoshi Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 394 days.

(21) Appl. No.: 14/000,834

(22) PCT Filed: Feb. 15, 2012

(86) PCT No.: PCT/JP2012/000981
§ 371 (c)(1),
(2), (4) Date: Aug. 21, 2013

(87) PCT Pub. No.: WO2012/114680
PCT Pub. Date: Aug. 30, 2012

(65) Prior Publication Data
US 2013/0319735 A1   Dec. 5, 2013

(30) Foreign Application Priority Data
Feb. 21, 2011 (JP) ................. 2011-034304

(51) Int. Cl.
*H05K 1/02* (2006.01)
*B32B 15/08* (2006.01)
(Continued)

(52) U.S. Cl.
CPC ............. *H05K 1/0271* (2013.01); *B32B 15/08* (2013.01); *B32B 15/14* (2013.01); *H05K 1/036* (2013.01);
(Continued)

(58) Field of Classification Search
None
See application file for complete search history.

(56) References Cited

U.S. PATENT DOCUMENTS

| | | | | |
|---|---|---|---|---|
| 7,087,296 B2 * | 8/2006 | Porter | ................. | B29C 66/721 428/223 |
| 2002/0012780 A1 * | 1/2002 | Yuyama | ................. | B32B 15/08 428/216 |

(Continued)

FOREIGN PATENT DOCUMENTS

| CN | 1326853 | 12/2001 |
|---|---|---|
| JP | S-60-12232 B2 | 3/1985 |

(Continued)

OTHER PUBLICATIONS

Machine translation of JP H06-338667 A Published Dec. 1994.*
(Continued)

*Primary Examiner* — Elizabeth A Robinson
*Assistant Examiner* — Daniel D Lowrey
(74) *Attorney, Agent, or Firm* — McDermott Will & Emery LLP

(57) ABSTRACT

A metal-clad laminate of the present invention comprises an insulating layer, and a metal layer that is present at least on one surface side of the insulating layer. The insulating layer is a laminate of at least three layers: a center layer, a first resin layer that is present on one surface side of the center layer, and a second resin layer that is present on the other surface side of the center layer. The center layer, the first resin layer and the second resin layer each contain a cured product of a respective resin composition. The elastic modulus of the cured product of the resin composition contained in the center layer is lower than the elastic moduli of both the cured product of the resin composition contained in the first resin layer and the cured product of the resin composition contained in the second resin layer.

10 Claims, 1 Drawing Sheet

(51) Int. Cl.
  *H05K 1/03*   (2006.01)
  *B32B 15/14*  (2006.01)
  *H05K 3/02*   (2006.01)

(52) U.S. Cl.
  CPC .... *B32B 2260/021* (2013.01); *B32B 2260/046* (2013.01); *B32B 2457/08* (2013.01); *H05K 1/0366* (2013.01); *H05K 3/022* (2013.01); *H05K 2201/0209* (2013.01); *H05K 2201/029* (2013.01); *Y10T 428/2495* (2015.01); *Y10T 428/24942* (2015.01); *Y10T 428/24967* (2015.01); *Y10T 428/24975* (2015.01)

(56) References Cited

U.S. PATENT DOCUMENTS

| | | | |
|---|---|---|---|
| 2003/0068520 A1 | 4/2003 | Ikegawa et al. | |
| 2007/0169886 A1* | 7/2007 | Watanabe | B32B 15/08 156/325 |
| 2009/0017308 A1* | 1/2009 | Kitano | C08J 5/24 428/414 |
| 2011/0024172 A1* | 2/2011 | Maruyama | H01L 23/49822 174/258 |
| 2011/0135911 A1 | 6/2011 | Maenaka et al. | |

FOREIGN PATENT DOCUMENTS

| | | |
|---|---|---|
| JP | H-6-338667 A | 12/1994 |
| JP | H-8-244165 A | 9/1996 |
| JP | S-63-21141 A | 1/1998 |
| JP | H-10-36463 A | 2/1998 |
| JP | 2006-049374 A | 2/2006 |
| JP | 2007-254530 A | 10/2007 |
| JP | 2007-296847 A | 11/2007 |
| JP | 2009-275086 A | 11/2009 |
| JP | 2010-000774 A | 1/2010 |
| JP | 2010-254807 A | 11/2010 |
| TW | 2009-04268 A | 1/2009 |
| TW | 2010-12641 A | 4/2010 |
| WO | WO-2010/084867 A1 | 7/2010 |

OTHER PUBLICATIONS

Taiwanese Office Action issued in Taiwanese Application No. 101105273 on Sep. 30, 2013, with partial translation, 8 pgs.
Chinese Search Report issued in CN 201280009444.0 dated Aug. 4, 2014, w/Partial English translation.
International Search Report issued in PCT/JP2012/000981 with Date of mailing May 15, 2012.

* cited by examiner

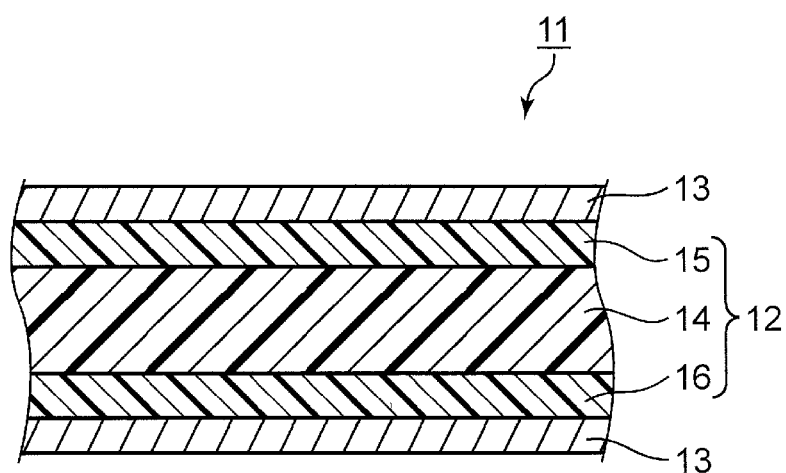

METAL-CLAD LAMINATE AND PRINTED WIRING BOARD

RELATED APPLICATIONS

This application is the U.S. National Phase under 35 U.S.C. §371 of International Application No. PCT/JP2012/000981, filed on Feb. 15, 2012, which in turn claims the benefit of Japanese Application No. 2011-034304, filed on Feb. 21, 2011, the disclosures of which Applications are incorporated by reference herein.

TECHNICAL FIELD

The present invention relates to a metal-clad laminate and to a printed wiring board that is produced using the metal-clad laminate.

BACKGROUND ART

Surface-mount packages have come to be widely used as electronic components that are provided in electronic devices, as the latter have grown smaller and thinner. Examples of such electronic component packages include, for instance, semiconductor packages in which an electronic component such as a semiconductor element is mounted on the surface of a substrate, and the electronic component is sealed with a resin. Specific examples include, for instance, semiconductor packages such as BOC (Board on Chip). Such electronic components adopt a structure such as that of a bimetal in which the sealing resin and the substrate are bonded to each other. As a result, deformation such as warping occurred in some instances on account of mismatches in the coefficients of thermal expansion (CTE) of the sealing resin and of the substrate. In particular, warping was likely to occur in cases where only one face of the substrate was resin-sealed. As a result, the electronic component is repeatedly flexed, on account of warping, if the electronic component is used in an environment where temperature changes are substantial. In some instances, this flexing resulted in degradation caused, for example, by formation of cracks near the surface of the substrate of the electronic component. This substrate degradation was apt to give rise to damage to the electronic component, for instance breakage of wiring on the substrate surface.

For instance, printed wiring boards, which are obtained by forming a circuit through partial removal of a metal layer, such as a metal foil, that is disposed on the surface of a metal-clad laminate, are used as substrates that are utilized in electronic components. Examples of such metal-clad laminates include, for instance, the metal-clad laminate disclosed in Patent Document 1.

Patent Document 1 discloses a metal foil-clad laminate that is formed using a prepreg that is provided with a fibrous base material, a first resin layer resulting from impregnating the fibrous base material with a first thermosetting resin composition, and one or more resin layers that are formed out of a thermosetting resin composition and are provided on the first resin layer, such that the elastic modulus of a resin film that is formed out of the first thermosetting resin composition is greater than the elastic modulus of a resin film that is formed out of a second thermosetting resin composition that forms a resin layer on an outermost surface of the prepreg, from among the one or more resin layers that are formed out of the thermosetting resin composition.

Patent Document 1 indicates that a printed wiring board can be obtained in which breakage of wiring during bending of the board is sufficiently prevented.

Examples of methods for producing a metal-clad laminate include, for instance, the method disclosed in Patent Document 2.

Patent Document 2 discloses a method for producing a metal foil-clad laminate that involves obtaining a prepreg through impregnation of a sheet-like base material with a thermosetting resin, followed by drying, overlaying a metal foil onto the surface of a layer of the prepreg, and press-forming the whole with heating, wherein the method comprises the steps of coating a roughened surface of the metal foil with a first resin composition that contains an acrylic rubber, an epoxy resin, a phenolic resin and an inorganic filler; coating the coated surface with a second resin composition having no tackiness in a dry state and having an elastic modulus higher than that of the first resin composition, followed by drying; overlaying the coated surface onto a layer of prepreg, and press-forming the whole with heating; and providing a low-elastic resin layer containing the first resin composition, having a thickness of 20 μm or greater, and an elastic modulus of 10 kgf/mm$^2$ or lower, directly below the metal foil.

Patent Document 2 indicates that the obtained metal foil-clad laminate is appropriate as a material of printed wiring boards for surface mounting, and that it is possible to secure solder connection reliability in surface-mounted parts of low thermal expansion even after repeated thermal cycles. In Patent Document 2, thus, a low-elasticity resin layer is disposed under a metal foil in order to relieve stress that acts on solder connections.

Patent Document 1: Japanese Patent Application Publication No. 2009-275086

Patent Document 2: Japanese Patent Application Publication No. H8-244165

SUMMARY OF THE INVENTION

The present invention provides a metal-clad laminate and a printed wiring board having high reliability.

The metal-clad laminate according to one aspect of the present invention comprises an insulating layer and a metal layer that is present at least on one surface side of the insulating layer; wherein the insulating layer is a laminate of at least three layers consisting of a center layer, a first resin layer that is present on one surface side of the center layer, and a second resin layer that is present on the other surface side of the center layer; the center layer, the first resin layer and the second resin layer each contain a cured product of a resin composition; the resin composition of the center layer is a resin composition that contains a thermosetting resin and that is different from the resin compositions of the first resin layer and the second resin layer; and an elastic modulus of the cured product of the resin composition contained in the center layer is lower than elastic moduli of both the cured product of the resin composition contained in the first resin layer and the cured product of the resin composition contained in the second resin layer.

A printed wiring board according to another aspect of the present invention is obtained through formation of a circuit by partial removal of the metal layer of the metal-clad laminate.

Objects, features, aspects and advantages of the present invention will be made more apparent on the basis of the detailed explanation below and accompanying drawings.

BRIEF DESCRIPTION OF THE DRAWINGS

FIG. 1 is a schematic cross-sectional diagram illustrating an example of a metal-clad laminate according to the present embodiment.

DESCRIPTION OF EMBODIMENTS

Studies by the inventors have revealed that occurrence of damage caused by deformation such as warping, that arises as a result of changes in temperature, failed in some instances to be sufficiently suppressed in substrates that are formed using the metal-clad laminate disclosed in Patent Document 1. Specifically, the inventors found that in some instances it was not possible to sufficiently suppress the occurrence of cracks near the surface of a substrate that was formed through partial removal of a metal layer of the metal-clad laminate. The purpose of the metal-clad laminate disclosed in Patent Document 1 is to form a pliable substrate that can be bent freely. That is, the object of the metal-clad laminate disclosed in Patent Document 1 is to suppress breakage of wiring, arising for instance from bending at a radius of 0.38 mm, rather than suppressing damage caused by deformation such as warping, that arises as a result of changes in temperature.

In some instances, it was not possible to sufficiently suppress the occurrence of damage caused by deformation, such as warping, that arises from temperature changes, in a substrate that was formed using the metal-clad laminate obtained in accordance with the method disclosed in Patent Document 2. Specifically, the inventors found that in some instances it was not possible to sufficiently suppress the occurrence of cracks near the surface of a substrate that was formed through partial removal of the metal layer of the metal-clad laminate.

As described above, a printed wiring board, which is a substrate formed through partial removal of a metal layer of a metal-clad laminate, is used as a substrate of electronic components. A solder resist layer or the like is overlaid on the portion of the substrate from which the metal layer is removed. Accordingly, it is found that in a case where the electronic component is used in an environment where temperature changes are significant, one cause of the occurrence of cracks is the difference between the coefficient of thermal expansion of the layer that is overlaid on the substrate, for instance a solder resist layer or the like, and the coefficient of thermal expansion of the portion of the substrate from which the metal layer is removed. Specifically, it is deemed that contraction and expansion of the solder resist layer, caused by temperature changes, is one cause of the occurrence of cracks.

The above suggests that the portion that is exposed through removal of the metal layer in the metal-clad laminate disclosed in Patent Document 1 and the metal-clad laminate obtained in accordance with the method disclosed in Patent Document 2 in cases where these laminates are used, has a low elastic modulus. It is deemed that, as a result, occurrence of cracks near the surface of the substrate fails to be sufficiently suppressed in some instances.

In the light of the above, the inventors conducted various studies regarding the occurrence of cracks near the surface in cases where a substrate formed through partial removal of a metal layer from a metal-clad laminate was used in an environment where temperature changes were substantial.

The inventors found, firstly, that the higher the flexural modulus of the metal-clad laminate, the greater the degree to which the occurrence of cracks could be suppressed. The inventors found also that the higher the elastic modulus of a cured product of a resin composition contained in the metal-clad laminate, the greater the degree to which the occurrence of cracks could be suppressed. Further, the inventors found that the elastic modulus of the cured product of the resin composition contained in the metal-clad laminate exerts a greater influence on crack occurrence than the flexural modulus of the metal-clad laminate.

Based on the above studies, the inventors speculated that increasing the elastic modulus of a cured product of a resin composition in a position near the metal layer might be more effective in suppressing the occurrence of cracks near the surface of the substrate than increasing the elastic moduli of cured products of resin compositions present in other portions, and arrived at the present invention as a result of further study on this approach.

Embodiments of the present invention are explained below, but the present invention is not limited to these embodiments.

The metal-clad laminate according to the present embodiment comprises an insulating layer and a metal layer that is present at least on one surface side of the insulating layer; wherein the insulating layer is a laminate of at least three layers consisting of a center layer, a first resin layer that is present on one surface side of the center layer, and a second resin layer that is present on the other surface side of the center layer; the center layer, the first resin layer and the second resin layer each contain a cured product of a resin composition; the resin composition of the center layer is a resin composition that contains a thermosetting resin and that is different from the resin compositions of the first resin layer and the second resin layer; and an elastic modulus of the cured product of the resin composition contained in the center layer is lower than elastic moduli of both the cured product of the resin composition contained in the first resin layer and of the cured product of the resin composition contained in the second resin layer. Hereafter, the elastic modulus of the cured product of the resin composition contained in the center layer will be simply referred to as "center elastic modulus". Similarly, the elastic modulus of the cured product of the resin composition contained in the first resin layer will be simply referred to hereafter as "first elastic modulus". The elastic modulus of the cured product of the resin composition contained in the second resin layer will be simply referred to hereafter as "second elastic modulus".

A metal-clad laminate of high reliability can be obtained by adopting a configuration such as the above-described one. Also, an electronic component that is obtained by using a substrate, such as a printed wiring board, in which circuits are formed through partial removal of the metal layer on the surface of the obtained metal-clad laminate, is also a highly reliable electronic component. Occurrence of damage, for instance occurrence of cracks near the surface of the substrate, can be sufficiently suppressed in such an electronic component, even when, for instance, the electronic component is used in an environment of substantial changes in temperature.

By contrast, the reliability of the obtained metal-clad laminate tends not to be sufficiently high if the center elastic modulus is equal to or higher than the first elastic modulus or equal to or higher than the second elastic modulus. Occurrence of damage that accompanies, for instance, changes in temperature may fail to be sufficiently suppressed in an electronic component or the like that is obtained using such a metal-clad laminate.

The reasons underlying the high reliability of the metal-clad laminate according to the present embodiment are deemed to be as follows.

Firstly, the elastic moduli of both cured products of the resin compositions contained in the first resin layer and second resin layer, which are closer to a surface layer than the center layer, are higher than the center elastic modulus. In consequence, the substrate that is formed out of the metal-clad laminate has a configuration wherein layers that contain a cured product of a resin composition the elastic modulus whereof is higher than the center elastic modulus are disposed at a position closer to a surface layer than the center layer. It is deemed that, accordingly, the elastic moduli of the cured products of the resin compositions contained in the first resin layer and second resin layer are comparatively high, and hence occurrence of cracks near the surface can be sufficiently suppressed, even upon repeated flexing through warping caused by temperature changes. That is, it is found that it becomes possible to sufficiently suppress occurrence of cracks, in the first resin layer and second resin layer that are disposed near the surface, which may lead to damage of electronic components, for instance wiring breakage.

It is likewise deemed that it becomes possible to sufficiently suppress occurrence of cracks near the surface as caused by expansion and contraction of a solder resist layer or the like, since the elastic moduli of the cured products of the resin compositions contained in the first resin layer and second resin layer that are disposed near the surface are comparatively high.

All the above suggests that it is possible to provide a metal-clad laminate of high reliability. It is likewise deemed that when producing an electronic component using the obtained metal-clad laminate, it becomes possible to produce an electronic component of sufficiently high reliability in which occurrence of damage, for instance occurrence of cracks near the surface of a substrate, is sufficiently suppressed even when the electronic component is used in an environment where temperature changes are substantial.

In the substrate formed using the metal-clad laminate, the resin composition of the center layer contains a thermosetting resin, and hence it is found that the substrate is comparatively rigid, unlike so-called flexible substrates, which are bendable. Occurrence of cracks near the surface, caused by deformation such as warping, can be suppressed by adopting a configuration such as that of the present embodiment, even in the case of such rigid substrates.

Herein, the term elastic modulus denotes, for instance, flexural modulus at 25° C. The flexural modulus can be calculated on the basis of the amount of deflection that is exhibited, when acted upon by a given load, by a cured product of a resin composition obtained through curing of the latter so as to yield a predetermined shape such as a plate-like shape. Specifically, the measurement can be carried out using for instance an Autograph tester by Shimadzu. The dimensions of the cured product that is to be measured are not particularly limited, and may be, for instance, width 5 mm×length 50 mm×thickness 2 mm. The measurement conditions may be ordinary measurement conditions, for instance conditions that involve a span of 16.5 mm and a test speed (crosshead speed) of 0.5 mm/minute.

The metal-clad laminate according to the present embodiment is not particularly limited otherwise, so long as it satisfies the above configuration. Specific examples of the metal-clad laminate include, for instance, the metal-clad laminate having a layer structure such as the one depicted in FIG. 1. Herein, FIG. 1 is a schematic cross-sectional diagram illustrating an example of a metal-clad laminate 11 according to the present embodiment.

Examples of the metal-clad laminate according to the present embodiment include, for instance, a metal-clad laminate comprising an insulating layer 12, and a metal layer 13 provided on either surface of the insulating layer 12, as illustrated in FIG. 1. Examples of the insulating layer 12 include, for instance, an insulating layer that is a laminate of three layers, namely, a center layer 14, a first resin layer 15 present on one surface side of the center layer 14 and a second resin layer 16 present on the other surface side of the center layer 14. The insulating layer 12 need only contain the first resin layer 15, the center layer 14 and the second resin layer 16, in this order, but may be provided with other layers. Specifically, an interlayer may be provided on the surface layer of the first resin layer 15 or the second resin layer 16 with a view to, for instance, enhancing adhesion between the metal layer 13 and the insulating layer 12. The surface layer of the first resin layer 15 or the second resin layer 16 is between the first resin layer 15 and the metal layer 13, or between the second resin layer 16 and the metal layer 13. Another layer may be provided between the first resin layer 15 and the center layer 14, but preferably the first resin layer 15 and the center layer 14 are directly laminated on each other. A metal-clad laminate having yet higher reliability can be obtained as a result. This may be attributed to the more pronounced effect of suppression of crack occurrence near the surface that can be achieved through the presence of the first resin layer 15. Similarly, another layer may be provided between the second resin layer 16 and the center layer 14, but preferably the second resin layer 16 and the center layer 14 are directly laminated on each other, for the same reasons as expounded regarding the first resin layer 15 and the center layer 14.

The insulating layer of the present embodiment is not particularly limited, so long as it is a laminate of at least three layers consisting of a center layer, a first resin layer present on one surface side of the center layer, and a second resin layer present on the other surface side of the center layer, as described above.

The thickness of the insulating layer is not particularly limited, but ranges preferably from 5 to 200 μm. If the insulating layer is excessively thin, the printed wiring board that is formed through partial removal of the metal layer may be too thin, and may tend to exhibit for instance insufficient mechanical strength. If the insulating layer is too thick, production of the metal-clad laminate tends to become more difficult. Also, an excessively thick insulating layer translates into a thicker metal-clad laminate, which precludes reductions in size and thickness of the substrate obtained from the metal-clad laminate and of the electronic component that is ultimately obtained.

The thickness of the center layer, first resin layer, second resin layer, insulating layer and metal-clad laminate can be measured by microscopic observation of a cross-section of the metal-clad laminate.

The center layer of the insulating layer is not particularly limited, so long as it satisfies the above-described configuration. Specifically, the center layer is not particularly limited so long as it contains a cured product of a resin composition, the resin composition contains a thermosetting resin and is a resin composition different from the resin compositions of the first resin layer and the second resin layer, and the center elastic modulus satisfies the following relationship. This relationship prescribes that the center elastic modulus is lower than the elastic moduli of both the cured product of the resin composition contained in the first resin layer and the cured product of the resin composition contained in the second resin layer.

The resin composition of the center layer is not particularly limited so long as the elastic modulus of the cured product thereof is lower than the elastic moduli of both the cured product of the resin composition contained in the first resin layer and the cured product of the resin composition contained in the second resin layer.

Preferably, the elastic modulus of the cured product of the resin composition of the center layer satisfies a relationship such as the below-described one. Preferably, the resin composition of the center layer satisfies a relationship wherein the first elastic modulus and the second elastic modulus each range from 115 to 900% with respect to the center elastic modulus. More preferably, there is satisfied a relationship of 140 to 900%. Yet more preferably, there is satisfied a relationship of 150 to 900%. That is, the resin composition of the center layer preferably satisfies a relationship such that the lower elastic modulus from among the first elastic modulus and second elastic modulus ranges from 115 to 900% with respect to center elastic modulus.

If the elastic modulus of the cured product of the resin composition of the center layer is not very low with respect to the first elastic modulus and second elastic modulus, then the center elastic modulus and the first elastic modulus and second elastic modulus are close to each other, and reliability tends to fail to be sufficiently enhanced. This may be attributed to the more pronounced effect of suppression of crack occurrence near the surface that can be achieved through the presence of the first resin layer and the second resin layer. That is, it is deemed that the higher the first elastic modulus and second elastic modulus with respect to the center elastic modulus, and the lower the center elastic modulus with respect to the first elastic modulus and second elastic modulus, the more pronounced becomes the effect of suppressing the occurrence of cracks. However, the above differences are limited in actuality, and it is found that the first elastic modulus and second elastic modulus are limited to be about 900% of the center elastic modulus. Accordingly, 900% is set as an upper limit. The following conceivable problems may arise assuming 900% is exceeded. Instances where 900% is exceeded include an instance where the center elastic modulus is too low with respect to the first elastic modulus and second elastic modulus, and an instance where the first elastic modulus and second elastic modulus are too high with respect to the center elastic modulus. In either instance, the center elastic modulus and the first elastic modulus and second elastic modulus are excessively disparate, and delamination between the center layer and the first resin layer, and between the center layer and the second resin layer tends to be likelier to occur.

The center elastic modulus at 25° C. ranges preferably from 1 to 27 GPa, more preferably from 3 to 27 GPa, and yet more preferably from 3 to 25 GPa. If the center elastic modulus is excessively low, the difference with respect to the first elastic modulus and second elastic modulus becomes excessively large, and delamination between the center layer and the first resin layer and between the center layer and the second resin layer tends to be likelier to occur. If the center elastic modulus is excessively high, reliability of the obtained metal-clad laminate tends to fail to be sufficiently enhanced. This is deemed to arise from the fact that the difference between the center elastic modulus and the first elastic modulus and second elastic modulus becomes too small, and the effect of suppression of crack occurrence near the surface, as elicited by virtue of the presence of the first resin layer and the second resin layer, cannot be sufficiently brought out.

Preferably, the center layer contains a cured product of a resin composition, such as the above-described one, and a fibrous base material. Preferably, the center layer is a layer obtained through impregnation of a fibrous base material with the resin composition of the center layer, and through curing of the resin composition. A metal-clad laminate having yet higher reliability can be provided as a result. The underlying reasons for this are deemed to be as follows. Preferably, the center layer contains not only the cured product of a resin composition, but also a fibrous base material. It is deemed that insulation reliability and bendability can be enhanced as a result. If the fibrous base material is absent, problems such as breakage tend to occur upon bending of the obtained metal-clad laminate. It is deemed that an electronic component having yet higher reliability can be produced as a result.

The fibrous base material is not particularly limited, and may be for instance a sheet-like fibrous base material. Specific examples of fibrous base materials include, for instance, inorganic-fiber woven fabrics such as glass cloth, inorganic-fiber nonwoven fabrics, aramid cloth, polyester cloth, paper and the like. The thickness of the fibrous base material is not particularly limited, but, for instance, ranges preferably from about 0.01 to 0.2 mm.

The resin composition of the center layer is not particularly limited so long as it satisfies relationships such as the above ones. Examples of the resin composition of the center layer include, for instance, epoxy resin compositions containing an epoxy compound and a curing agent.

The epoxy compound is not particularly limited, and examples thereof include, for instance, epoxy compounds that have two or more epoxy groups per molecule. More specific examples include, for instance, bisphenol-type epoxy resins, novolac-type epoxy resins, phenol novolac-type epoxy resins, alicyclic epoxy resins, heterocyclic epoxy resins and the like. The foregoing may be used singly or in combinations of two or more types.

The curing agent that is used is not particularly limited. Specific examples of the curing agent, which is capable of curing the epoxy compound, include, for instance, imidazole-based curing agents and the like.

Preferably, the resin composition of the center layer contains a radical polymerization-type thermosetting compound. A metal-clad laminate having yet higher reliability can be provided as a result. The underlying reasons for this are deemed to be as follows.

Firstly, it is deemed that the resin composition of the center layer can be suitably cured, and that a suitable center layer can be formed, by virtue of the fact that the resin composition of the center layer contains the radical polymerization-type thermosetting compound. It is likewise deemed that, in a case where the center layer contains a fibrous base material such as glass cloth, the center layer is a layer obtained through impregnation of the fibrous base material with the resin composition, and curing of the resin composition. It is found that when the resin composition of the center layer contains thus a radical polymerization-type thermosetting compound, the impregnation ability of the resin composition into the fibrous base material is excellent, and there can be formed a more suitable center layer. It is deemed that, as a result of all the above, a metal-clad laminate can be provided that has yet higher reliability. It is further deemed that thanks to the presence of the radical polymerization-type thermosetting compound in the resin composition of the center layer, the latter can be suitably cured, and continuous production of the metal-clad laminate is made easier.

Such a radical polymerization-type thermosetting compound is not particularly limited. Examples of the radical polymerization-type thermosetting compound include, for instance, radical polymerization-type thermosetting monomers, radical polymerization-type thermosetting resins and the like.

Examples of radical polymerization-type thermosetting monomers include, for instance, monomers having at least one radical-polymerizable unsaturated group per molecule. Specific examples thereof include, for instance, styrene, methyl styrene, halogenated styrene, (meth)acrylic acid, methyl methacrylate, ethyl methacrylate, butyl acrylate, divinyl benzene, ethylene glycol di(meth)acrylate, propylene glycol di(meth)acrylate, trimethylolpropane tri(meth)acrylate, pentaerythritol tri(meth)acrylate, pentaerythritol tetra(meth)acrylate or the like. The foregoing may be used singly or in combinations of two or more types.

Examples of radical polymerization-type thermosetting resins include, for instance, resins having at least two radical-polymerizable unsaturated groups per molecule. Specific examples include, for instance, vinylester resins, which are reaction products of an epoxy resin and an unsaturated fatty acid such as acrylic acid or methacrylic acid; unsaturated polyesters, which are reaction products of propylene glycol, bisphenol A-propylene oxide adducts or the like with a polybasic unsaturated acid such as maleic anhydride or fumaric acid; or bisphenol A-type methacrylates. The foregoing may be used singly or in combinations of two or more types.

In a case where such radical polymerization-type thermosetting compounds are utilized, the resin composition preferably contains a radical polymerization agent. Specific examples of radical polymerization initiators include, for instance, organic peroxides such as ketone peroxides, for instance methyl ethyl ketone peroxide, methyl isobutyl ketone peroxide, cyclohexanone peroxide or the like; diacyl peroxides such as benzoyl peroxide, isobutyl peroxide or the like; hydroperoxides such as cumene hydroperoxide, t-butyl hydroperoxide or the like; dialkyl peroxides such as dicumyl peroxide, di-t-butyl peroxide or the like; peroxyketals such as 1,1-di-t-butylperoxy-3,3,5-trimethylcyclohexanone, 2,2-di-(t-butylperoxy)butane or the like; alkyl peresters such as t-butylperbenzoate, t-butyl peroxy-2-ethylhexanoate or the like; and percarbonates such as bis(4-t-butylcyclohexyl) peroxydicarbonate, t-butylperoxyisobutyl carbonate or the like, and inorganic peroxides such as hydrogen peroxide or the like. The foregoing may be used singly or in combinations of two or more types.

The resin composition of the center layer may contain an elastomer, an inorganic filler and the like.

The elastomer is not particularly limited, and examples thereof include, for instance, low-volatile liquid rubber such as liquid polybutadiene, liquid NBR or the like; and cross-linked or non-crosslinked rubber particles of NBR rubber, SBR rubber, acrylic rubber, silicone rubber, polyrotaxanes or the like.

The inorganic filler is not particularly limited, and examples thereof include, for instance, spherical silica, alumina and the like. The content of the inorganic filler is preferably such that the center elastic modulus can satisfy the above-described relationship.

Preferably, the resin composition of the center layer is a liquid resin composition. That is, the epoxy compound and the radical polymerization-type thermosetting compound contained in the resin composition are preferably liquids. A metal-clad laminate having yet higher reliability can be provided as a result. The underlying reasons for this are deemed to be as follows.

Firstly, it is deemed that a suitable center layer can be formed that has, for instance, a smooth surface, by using a liquid resin composition as the resin composition of the center layer. It is likewise deemed that, in a case where the center layer contains a fibrous base material such as glass cloth, the center layer is a layer obtained through impregnation of the fibrous base material with the resin composition, and curing of the resin composition. It is found that a more suitable center layer can be formed thereupon that boasts excellent impregnation ability of the resin composition into the fibrous base material, by using a liquid resin composition as the resin composition of the center layer. It is deemed that, as a result of all the above, a metal-clad laminate can be provided that has yet higher reliability, and that continuous production of the metal-clad laminate is facilitated by using a liquid resin composition as the resin composition of the center layer.

Preferably, the resin composition of the center layer is a resin composition that contains no solvent, i.e. is a solvent-free resin composition. This allows the metal-clad laminate to be produced continuously.

The first resin layer and second resin layer of the insulating layer are not particularly limited, so long as they satisfy the above-described features. Specifically, the first resin layer and second resin layer are not particularly limited so long as they contain a cured product of a resin composition, the resin compositions are different from the resin composition of the center layer, and the center elastic modulus satisfies the above relationship. This relationship is a relationship that prescribes that the center elastic modulus be lower than the elastic moduli of both the cured product of the resin composition contained in the first resin layer and the cured product of the resin composition contained in the second resin layer. That is, the relationship is a relationship such that the lower from among the first elastic modulus and second elastic modulus is higher than the elastic modulus of the cured product of the resin composition contained in the center layer.

The first resin layer and the second resin layer may have the same composition or dissimilar compositions so long as the first resin layer and the second resin layer satisfy the above-described relationship.

Preferably, the thickness of the first resin layer and the thickness of the second resin layer each range from 5 to 50% with respect to the thickness of the center layer. Specifically, the thicknesses of first resin layer and second resin layer each range preferably from 1 to 25 µm. A metal-clad laminate having yet higher reliability can be provided by setting the first resin layer and second resin layer to have such a thickness. This may be attributed to the more pronounced effect of suppression of crack occurrence near the surface that can be achieved through the presence of the first resin layer and the second resin layer.

The resin compositions of the first resin layer and second resin layer are not particularly limited, so long as the respective elastic moduli of the cured products are higher than that of the center elastic modulus.

The first elastic modulus and second elastic modulus at 25° C. range preferably from 1 to 30 GPa, more preferably from 3 to 30 GPa, and yet more preferably from 5 to 30 GPa. If the first elastic modulus and second elastic modulus are excessively low, reliability of the obtained metal-clad laminate tends to fail to be sufficiently enhanced. Specifically, for instance, problems tend to arise readily during semiconductor mounting by wire bonding or the like. This is deemed to arise from the fact that the difference between the center elastic modulus and the first elastic modulus and second elastic modulus becomes too small, and the effect of suppression of crack occurrence near the surface, as elicited by virtue of the presence of the first resin layer and the second resin layer, cannot be sufficiently brought out. If the first elastic modulus and second elastic modulus are excessively high, the difference thereof with respect to the center elastic modulus becomes excessively large, and delamination between the center layer and the first resin layer, and between the center layer and the second resin layer tends to be likelier to occur. Achieving a first elastic modulus and second elastic modulus in excess of 30 GPa is difficult in practice.

Accordingly, a metal-clad laminate having yet higher reliability can be provided if the first elastic modulus and second elastic modulus lie within the above-described range. This may be attributed to the more pronounced effect of suppression of crack occurrence near the surface that can be achieved through the presence of the first resin layer and the second resin layer.

The resin compositions of the first resin layer and second resin layer are not particularly limited, so long as they satisfy the above relationship, and are different from the resin composition of the center layer. Specific examples include, for instance, epoxy resin compositions that contain an epoxy compound and a curing agent.

The epoxy compound is not particularly limited. For instance, there can be suitably used an epoxy compound having two or more epoxy groups per molecule, and that yields a cured product having higher elasticity than the cured product of the resin composition contained in the center layer. More specific examples include, for instance, cresol novolac-type epoxy resins, bisphenol F-type epoxy resins, phenol novolac-type epoxy resins, dicyclopentadiene-type epoxy resins, biphenyl-type epoxy resins, naphthalene-type epoxy, bisphenol A-type epoxy resins and phenol aralkyl-type epoxy resins. The foregoing may be used singly or in combinations of two or more types.

The curing agent is not particularly limited. Specific examples thereof include, for instance, a cured product resulting from curing an epoxy compound, and that yields a cured product having higher elasticity than the cured product of the resin composition contained in the center layer. More specific examples include, for instance, phosphorus-modified phenolic resins or the like. The phosphorus-modified phenolic resin is not particularly limited. Specific examples include, for instance, a resin resulting from bonding a phosphorus compound such as 9,10-dihydro-9-oxa-10-phosphaphenanthrene-10-oxide or the like to an aliphatic carbon or the like of a phenolic resin. A commercially available product can be used as the curing agent. Specific examples of commercially available products include, for instance, EXB9000 by DIC Corporation and EXB9005 by DIC Corporation.

The resin compositions of the first resin layer and second resin layer may contain an inorganic filler or the like. The inorganic filler is not particularly limited, and examples thereof include, for instance, spherical silica, alumina and the like. Preferably, the content of the inorganic filler is such that allows the first elastic modulus and second elastic modulus to satisfy the above-described relationship.

The first resin layer and second resin layer need only contain at least a cured product of a resin composition such as the above-described ones, and may lack a fibrous base material. That is, the first resin layer and second resin layer may be layers that contain a cured product of a resin composition. Preferably, the first resin layer and second resin layer are layers that contain a cured product of a resin composition.

The metal layer of the metal-clad laminate is not particularly limited. Specific examples thereof include, for instance, metal foils that can be used as metal layers in metal-clad laminates. Examples of the metal foil include, for instance, copper foil such as electrolytic copper foil. The thickness of the metal foil is not particularly limited, and ranges preferably, for instance, from 2 to 35 µm. Specific examples of the metal layer include, for instance, an electrolytic copper foil (3EC-VLP, thickness 12 µm, by Mitsui Mining & Smelting).

The metal-clad laminate may be a metal-clad laminate in which the metal layer is disposed on one face of the insulating layer, or a metal-clad laminate in which the metal layer is disposed on either face of the insulating layer, but is preferably a metal-clad laminate in which the metal layer is disposed on either face of the insulating layer. As a result, a substrate having metal wiring formed on both faces can thus be formed through partial removal of the metal layers from the surface. A metal-clad laminate of high reliability can be thus obtained such that metal wiring can be formed on both faces of the metal-clad laminate. Also, a highly reliable electronic component can be produced by producing the electronic component using such a metal-clad laminate.

The method for producing the metal-clad laminate is not particularly limited, so long as it allows producing a metal-clad laminate having the above-described features. Specific examples include, for instance, the below-described method.

Firstly, the fibrous base material is impregnated with the resin composition of the center layer. Impregnation can be achieved for instance through dipping, coating or the like. A prepreg for forming the center layer can be obtained as a result.

A metal foil that constitutes the metal layer is coated with the resin composition of the first resin layer. The metal foil coated with the resin composition is overlaid in such a manner that the resin composition comes into contact with one of the faces of the prepreg for forming the center layer. A metal foil that constitutes the metal layer is coated with the resin composition of the second resin layer. A metal foil coated with the resin composition is overlaid in such a manner that the resin composition comes into contact with the other face of the prepreg for forming the center layer.

Thereafter, the laminate including the prepreg is dried and heated. The resin compositions contained in the respective layers are thermally cured as a result, and a metal-clad laminate is obtained.

A method has been explained above in which the resin compositions that make up the first resin layer and second resin layer are first applied onto a metal foil, but the method is not limited thereto, and for instance a method may be resorted to wherein firstly the prepreg for forming the center layer is coated with the resin compositions, and the metal foils are overlaid thereafter.

A printed wiring board can then be obtained by forming circuits in the metal layers of the obtained metal-clad laminate through etching or the like. That is, a printed wiring board provided with a conductor pattern in the form of circuits on the surface of the laminate can be obtained by forming circuits, through etching or the like, in the metal layers of the obtained metal-clad laminate. The printed wiring board thus obtained boasts high reliability.

The present invention is explained more specifically below based on examples, but the invention is not limited to these examples.

EXAMPLES

Example 1

Firstly, a resin composition was prepared, as the resin composition of the center layer, that is formed of 35 parts by mass of bisphenol A-type methacrylate (NK oligo EA1020, by Shin-Nakamura Chemical), 35 parts by mass of a phenol novolac epoxy resin (Epiclon N740, epoxy resin containing two or more epoxy groups per molecule, by DIC Corporation), 30 parts by mass of styrene (by Nippon Steel Chemical) as a radical polymerization-type thermosetting monomer, 1 part by mass of cumene hydroperoxide (CHP) (Percumyl H-80, by NOF Corporation) as a radical polymerization initiator, 1 part by mass of 2-ethyl-4-methylimidazole (2E4MZ) (by Shikoku Kasei) as a curing agent, 75 parts by mass of aluminum hydroxide particles (CL303 by Sumitomo Chemical) as an inorganic filler, 65 parts by mass of silica particles (SO25R by Admatechs) as an inorganic filler, and 18 parts by mass of a cyclic phosphazene compound (SPB100, by Otsuka Chemical). As the prepreg for forming the center layer there was prepared a prepreg (resin impregnation base material) resulting from impregnating glass cloth (1504 type, plain weave) with the above resin composition.

Electrolytic copper foil (3EC-VLP, thickness 12 μm, by Mitsui Mining & Smelting) was prepared as the metal foil that constitutes the metal layer.

As the resin composition of the first resin layer there was prepared a resin composition that is formed of 50.95 parts by mass of a cresol novolac-type epoxy resin (N690, by DIC Corporation), 49.05 parts by mass of a phenolic curing agent (EXB9000, by DIC Corporation), 45 parts by mass of aluminum hydroxide particles (CL303 by Sumitomo Chemical) as an inorganic filler; 75 parts by mass of spherical silica having been surface-treated with epoxysilane (SC-2500-SEJ, by Admatechs) as an inorganic filler, and 0.05 part by mass of 2-ethyl-4-methylimidazole (2E4MZ) (by Shikoku Kasei) as a curing agent. To form the first resin layer, methyl ethyl ketone (MEK) was added to the above resin composition, so as to yield a solids concentration of 60 mass %, and the resin composition was used in the form of a varnish in the same way as in the formation of the first resin layer.

The resin composition prepared as the resin composition of the second resin layer was identical to that of the first resin layer. To form the second resin layer, MEK was added to the above resin composition, so as to yield a solids concentration of 60 mass %, and the resin composition was used in the form of a varnish.

The metal foil was coated with the resin composition of the first resin layer to a thickness of 10 μm.

A separate metal foil was coated with the resin composition of the second resin layer to a thickness of 10 μm.

The metal foils coated with the resin compositions were overlaid on the prepreg in such a manner that the resin compositions came into contact with respective faces of the prepreg for forming the center layer.

Thereafter, the obtained laminate was dried for 15 minutes at 100° C. The laminate was then dried for 15 minutes at 200° C.

The resin compositions contained in the respective layers were thermally cured as a result, and a metal-clad laminate was obtained.

The elastic modulus of the cured product of the resin composition contained in the center layer (center elastic modulus) of the obtained metal-clad laminate was 4.9 GPa. The elastic modulus of the cured product of the resin composition contained in the first resin layer (first elastic modulus) was 8.7 GPa. The elastic modulus of the cured product of the resin composition contained in the second resin layer (second elastic modulus) was 8.7 GPa. The various elastic moduli are each the elastic modulus of a cured product, obtained through curing of the resin composition that makes up the respective layer so as to yield a predetermined shape such as a plate-like shape. The measurement method involves measuring the flexural modulus at 25° C. using an Autograph tester by Shimadzu of a cured product obtained from the resin composition that makes up each layer. A cured product having width 5 mm×length 50 mm×thickness 2 mm was used as the cured product to be measured in the measurement of elastic modulus. The measurement conditions included a span of 16.5 mm and a test speed (crosshead speed) of 0.5 mm/minute.

The center layer, first resin layer, second resin layer and metal-clad laminate were 130 μm, 10 μm, 10 μm and 174 μm, respectively. Each thickness was measured through microscopic observation of a cross-section of the obtained metal-clad laminate.

Example 2

The resin composition of the first resin layer and the resin composition of the second resin layer that were used were identical to those of Example 1, but herein the content of aluminum hydroxide particles (CL303, by Sumitomo Chemical) as an inorganic filler was modified from 45 parts by mass to 0 parts by mass, and the content of spherical silica having been surface-treated with epoxysilane (SC-2500-SEJ, by Admatechs) as an inorganic filler was modified from 75 parts by mass to 20 parts by mass.

The center elastic modulus in the obtained metal-clad laminate was 4.9 GPa, the first elastic modulus was 5.4 GPa, and the second elastic modulus was 5.4 GPa.

Example 3

The resin composition of the first resin layer and the resin composition of the second resin layer that were used were identical to those of Example 1, but herein the content of aluminum hydroxide particles (CL303, by Sumitomo Chemical) as an inorganic filler was modified from 45 parts by mass to 0 parts by mass, and the content of spherical silica having been surface-treated with epoxysilane (SC-2500-SEJ, by Admatechs) as an inorganic filler was modified from 75 parts by mass to 400 parts by mass.

The center elastic modulus in the obtained metal-clad laminate was 4.9 GPa, the first elastic modulus was 10.8 GPa, and the second elastic modulus was 10.8 GPa.

Example 4

A metal-clad laminate was produced in the same way as in Example 1, but herein the thicknesses of center layer, the first resin layer and the second resin layer were set to 138 μm, 6 μm and 6 μm, respectively.

Example 5

A metal-clad laminate was produced in the same way as in Example 1, but herein the thicknesses of the center layer, the first resin layer and the second resin layer were set to 20 μm, 20 μm and 20 μm, respectively.

Example 6

A metal-clad laminate was produced in the same way as in Example 1, but herein the thicknesses of the center layer, the first resin layer and the second resin layer were set to 80 μm, 35 μm and 35 μm, respectively.

Example 7

A metal-clad laminate was produced in the same way as in Example 1, but herein the thicknesses of center layer, the first resin layer and the second resin layer were set to 260 μm, 20 μm and 20 μm, respectively.

Comparative Example 1

The example was identical to Example 1, but herein the below-described composition was used as the resin composition of the first resin layer and the resin composition of the second resin layer.

The resin composition of the first resin layer and the resin composition of the second resin layer that were used were identical to those of Example 1, but herein the content of aluminum hydroxide particles (CL303, by Sumitomo Chemical) as an inorganic filler was modified from 45 parts by mass to 0 parts by mass, and the content of spherical silica having been surface-treated with epoxysilane (SC-2500-SEJ, by Admatechs) as an inorganic filler was modified from 75 parts by mass to 0 parts by mass.

The center elastic modulus in the obtained metal-clad laminate was 4.9 GPa, the first elastic modulus was 4.8 GPa, and the second elastic modulus was 4.8 GPa.

Comparative Example 2

The example was identical to Example 1, but herein no first resin layer or second resin layer was provided, and the thickness of the center layer was set to 150 μm.

Evaluation Methods

The obtained copper-clad laminates (metal-clad laminates) were evaluated as follows.

Elastic Modulus

The elastic modulus was measured in accordance with the same method as that for the elastic modulus of a cured product of a resin composition. Specifically, the flexural modulus at 25° C. of the obtained copper-clad laminates was measured using an Autograph tester by Shimadzu. Herein there was used a copper-clad laminate, as the object to be measured, cut to width 5 mm×length 50 mm×thickness 2 mm. The measurement conditions included a span of 16.5 mm and a test speed (crosshead speed) of 0.5 mm/minute.

Crack Incidence

Herein, 61 dummy land patterns (diameter ϕ0.45 mm) were created on each obtained copper-clad laminate (length 11 mm×width 9 mm). A solder resist (PSR-4000 AUS-308) was applied onto the region at which land marks were formed on the copper-clad laminate, in which the dummy land patterns had been created, to form thereby a solder resist layer on the copper-clad laminate having the dummy land patterns formed thereon. The solder resist layer was formed in such a manner that openings having a diameter ϕ0.40 mm were formed on the land patterns having a diameter ϕ0.45 mm. Specifically, a solder resist layer was formed in such a manner that solder-mask defined (SMD) connection pads were formed on the copper-clad laminate in which the dummy land patterns had been created. The specimen thus produced was subjected to 1000 cycles of thermal shock at −65° C. and 125° C. The solder resist surface on the dummy land patterns was observed by microscopy. The occurrence or absence of cracks was checked, and the number of cracks that occurred was tallied. Crack incidence after 1000 cycles was calculated on the basis of this number of occurrences.

The evaluation results are given in Table 1 alongside with elastic modulus, thickness and so forth.

TABLE 1

|  |  | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Elastic modulus of a cured product | Center layer (GPa) | 4.9 | 4.9 | 4.9 | 4.9 | 4.9 | 4.9 | 4.9 | 4.9 | 4.9 |
|  | First resin layer (GPa) | 8.7 | 5.4 | 10.8 | 8.7 | 8.7 | 8.7 | 8.7 | 4.8 | — |
|  | Second resin layer (GPa) | 8.7 | 5.4 | 10.8 | 8.7 | 8.7 | 8.7 | 8.7 | 4.8 | — |
|  | First resin layer/center layer (%) | 177.6 | 110.2 | 220.4 | 177.6 | 177.6 | 177.6 | 177.6 | 98.0 | — |
| Thickness | Center layer (μm) | 130 | 130 | 130 | 138 | 20 | 80 | 260 | 130 | 150 |
|  | First resin layer (μm) | 10 | 10 | 10 | 6 | 20 | 35 | 20 | 10 | — |
|  | Second resin layer (μm) | 10 | 10 | 10 | 6 | 20 | 35 | 20 | 10 | — |
|  | First resin layer/center layer (%) | 7.7 | 7.7 | 7.7 | 4.3 | 100.0 | 43.8 | 7.7 | 7.7 | — |
|  | Center layer + first resin layer + second resin layer (μm) | 150 | 150 | 150 | 150 | 60 | 150 | 300 | 150 | 150 |
| Evaluation | Elastic modulus (GPa) | 20.5 | 13.5 | 25.9 | 13.2 | 19.8 | 23.1 | 20.4 | 11.5 | 12.1 |
|  | Crack incidence (%) | 26.2 | 31.8 | 21.1 | 32.1 | 26.9 | 23.8 | 26.3 | 35.7 | 35.1 |

As Table 1 shows, the metal-clad laminates of Examples 1 to 7 exhibited fewer cracks on the surface than the metal-clad laminates of Comparative Example 1 and Comparative Example 2.

Examples 1 to 3 indicate that the higher the ratio of the first elastic modulus and second elastic modulus with respect to the center elastic modulus, the less likely the occurrence of cracks is. Specifically, occurrence of cracks can be further suppressed if this ratio is 115% or higher. In practice there is a limit to how much the rate can be increased, which is deemed to be of about up to 900%.

A comparison between Example 1 and Example 4 shows that the crack occurrence suppression effect is weak when the thicknesses of the first resin layer and second resin layer is small with respect to the thickness of the center layer. When the thicknesses of the first resin layer and second resin layer are large with respect to the thickness of the center layer, the center layer is thinner, and the glass cloth is likewise thinner. Accordingly, the elastic modulus of the metal-clad laminate plate drops, and the coefficient of thermal expansion (CTE) drops as well. This can be observed in Example 1, Example 5 and Example 6.

If the total thickness of the insulating layer, i.e. the center layer plus the first resin layer and the second resin layer is excessively large, as in Example 7, winding and continuous production tend to be difficult.

As described above, the present description sets forth technical features of the various aspects described above, and which can be summarized as follows.

The metal-clad laminate according to one aspect of the present invention comprises an insulating layer and a metal layer that is present at least on one surface side of the insulating layer; wherein the insulating layer is a laminate of at least three layers consisting of a center layer, a first resin layer that is present on one surface side of the center layer, and a second resin layer that is present on the other surface side of the center layer; the center layer, the first resin layer and the second resin layer each contain a cured product of a resin composition; the resin composition of the center layer is a resin composition that contains a thermosetting resin and that is different from the resin compositions of the first resin layer and the second resin layer; and an elastic modulus of the cured product of the resin composition contained in the center layer is lower than elastic moduli of both the cured product of the resin composition contained in the first resin layer and the cured product of the resin composition contained in the second resin layer.

Such a configuration allows providing a metal-clad laminate of high reliability. It is likewise deemed that when producing an electronic component using the obtained metal-clad laminate, it becomes possible to produce an electronic component of sufficiently high reliability in which occurrence of damage, for instance occurrence of cracks near the surface of a substrate, is sufficiently suppressed even when the electronic component is used in an environment where temperature changes are substantial.

The underlying reasons for this are deemed to be as follows.

Both elastic moduli of the cured products of the resin compositions contained in the first resin layer and the second resin layer, closer to a surface layer than the center layer, are higher than the elastic modulus of the cured product of the resin composition contained in the center layer. In consequence, the substrate that is formed out of the metal-clad laminate has a configuration wherein layers that contain a cured product of a resin composition the elastic modulus whereof is higher than the elastic modulus of the cured product of the resin composition contained in the center layer are disposed at a position closer to a surface layer than the center layer. It is deemed that, accordingly, the elastic moduli of the cured products of the resin compositions contained in the first resin layer and second resin layer are comparatively high, and hence it becomes possible to sufficiently suppress occurrence of cracks, in the first resin layer and second resin layer that are disposed near the surface, which may lead to damage of electronic components, for instance wiring breakage, even upon repeated flexing through warping caused by temperature changes.

It is likewise deemed that it becomes possible to sufficiently suppress occurrence of cracks near the surface as caused by expansion and contraction of a solder resist layer or the like, which is layered at a portion of the substrate from which the metal layer is removed, since the elastic moduli of the cured products of the resin compositions contained in the first resin layer and second resin layer that are disposed near the surface is comparatively high.

All the above suggests that it is possible to provide a metal-clad laminate of high reliability. It is likewise deemed that when producing an electronic component using the obtained metal-clad laminate, it becomes possible to produce an electronic component of sufficiently high reliability in which occurrence of damage, for instance occurrence of cracks near the surface of a substrate, is sufficiently suppressed even when the electronic component is used in an environment where temperature changes are substantial.

In the substrate formed using the metal-clad laminate, the resin composition of the center layer contains a thermosetting resin, and hence it is found that the substrate is comparatively rigid, unlike so-called flexible substrates, which are bendable. Occurrence of cracks near the surface, caused by deformation such as warping, can be suppressed by adopting a configuration such as the above one, even in the case of such rigid substrates.

In the metal-clad laminate, preferably, the elastic modulus of the cured product of the resin composition contained in the first resin layer and the elastic modulus of the cured product of the resin composition contained in the second resin layer each range from 115 to 900% of the elastic modulus of the cured product of the resin composition contained in the center layer.

Such a configuration allows providing a metal-clad laminate having yet higher reliability. Occurrence of cracks near the surface of a substrate can be further suppressed, and an electronic component having yet higher reliability can be produced, when the electronic component is produced using the obtained metal-clad laminate.

This may be attributed to the more pronounced effect of suppression of crack occurrence near the surface that can be achieved through the presence of the first resin layer and the second resin layer.

In the metal-clad laminate, preferably, the center layer contains a fibrous base material.

Such a configuration allows providing a metal-clad laminate having yet higher reliability. An electronic component having yet higher reliability can be produced by producing the electronic component using the obtained metal-clad laminate.

The underlying reasons for this are deemed to be as follows.

Preferably, the center layer contains not only the cured product of a resin composition, but also a fibrous base material. It is deemed that insulation reliability and bendability can be enhanced as a result. It is deemed that an electronic component having yet higher reliability can be produced as a result.

In the metal-clad laminate, preferably, the thickness of the first resin layer and the thickness of the second resin layer each range from 5 to 50% of the thickness of the center layer.

Such a configuration allows providing a metal-clad laminate having yet higher reliability. Occurrence of cracks near the surface of a substrate can be further suppressed, and an electronic component having yet higher reliability can be produced, when the electronic component is produced using the obtained metal-clad laminate.

This may be attributed to the more pronounced effect of suppression of crack occurrence near the surface that can be achieved through the presence of the first resin layer and the second resin layer.

In the metal-clad laminate, preferably, the thicknesses of the first resin layer and the second resin layer each range from 1 to 25 μm.

Such a configuration allows providing a metal-clad laminate having yet higher reliability. Occurrence of cracks near the surface of a substrate can be further suppressed, and an electronic component having yet higher reliability can be produced, when the electronic component is produced using the obtained metal-clad laminate.

This may be attributed to the more pronounced effect of suppression of crack occurrence near the surface that can be achieved through the presence of the first resin layer and the second resin layer.

In the metal-clad laminate, preferably, the thickness of the insulating layer ranges from 5 to 200 μm.

Such a configuration allows providing a metal-clad laminate having yet higher reliability. Occurrence of cracks near the surface of a substrate can be further suppressed, and an electronic component having yet higher reliability can be produced, when the electronic component is produced using the obtained metal-clad laminate.

This is deemed to arise from the fact that rigidity and insulating properties can be enhanced once the thickness of the insulating layer is of a certain extent.

In the metal-clad laminate, preferably, the resin composition of the center layer contains a radical polymerization-type thermosetting compound.

Such a configuration allows providing a metal-clad laminate having yet higher reliability. Occurrence of cracks near the surface of a substrate can be further suppressed, and an electronic component having yet higher reliability can be produced, when the electronic component is produced using the obtained metal-clad laminate.

The underlying reasons for this are deemed to be as follows.

Firstly, it is deemed that thanks to the presence of the radical polymerization-type thermosetting compound in the resin composition of the center layer, the latter can be suitably cured, and continuous production of the metal-clad laminate is made easier.

It is likewise deemed that, in a case where the center layer contains a fibrous base material such as glass cloth, the center layer is a layer obtained through impregnation of the fibrous base material with the resin composition, and curing of the resin composition. It is found that when the resin composition of the center layer contains thus a radical polymerization-type thermosetting compound, the impregnation ability of the resin composition into the fibrous base material is excellent, and there can be formed a more suitable center layer.

It is deemed that, as a result of all the above, a metal-clad laminate can be provided that has yet higher reliability.

In the metal-clad laminate, preferably, the resin composition of the center layer is a liquid resin composition.

Such a configuration allows providing a metal-clad laminate having yet higher reliability. Occurrence of cracks near the surface of a substrate can be further suppressed, and an electronic component having yet higher reliability can be produced, when the electronic component is produced using the obtained metal-clad laminate.

The underlying reasons for this are deemed to be as follows.

Firstly, it is deemed that a suitable center layer can be formed that has, for instance, a smooth surface, by using a liquid resin composition as the resin composition of the center layer.

It is likewise deemed that, in a case where the center layer contains a fibrous base material such as glass cloth, the center layer is a layer obtained through impregnation of the fibrous base material with the resin composition, and curing of the resin composition. It is found that a more suitable center layer can be formed thereupon that boasts excellent impregnation ability of the resin composition into the fibrous base material, by using a liquid resin composition as the resin composition of the center layer.

It is deemed that, as a result of all the above, a metal-clad laminate can be provided that has yet higher reliability.

In the metal-clad laminate, preferably, the elastic modulus of the cured product of the resin composition contained in the first resin layer and the elastic modulus of the cured product of the resin composition contained in the second resin layer each range from 1 to 30 GPa at 25° C.

Such a configuration allows providing a metal-clad laminate having yet higher reliability. Occurrence of cracks near the surface of a substrate can be further suppressed, and an electronic component having yet higher reliability can be produced, when the electronic component is produced using the obtained metal-clad laminate.

This may be attributed to the more pronounced effect of suppression of crack occurrence near the surface that can be achieved through the presence of the first resin layer and the second resin layer.

In the metal-clad laminate, preferably, the metal layer is disposed on either face of the insulating layer.

By virtue of such a configuration, a substrate having metal wiring formed on both faces can thus be formed through partial removal of the metal layer from the surface. A metal-clad laminate of high reliability can be thus obtained such that metal wiring can be formed on both faces of the metal-clad laminate. Also, a highly reliable electronic component can be produced by producing the electronic component using such a metal-clad laminate.

A printed wiring board according to another aspect of the present invention is obtained through formation of a circuit by partial removal of the metal layer of the metal-clad laminate.

Such a configuration allows providing a highly reliable printed wiring board.

INDUSTRIAL APPLICABILITY

The present invention succeeds in providing a metal-clad laminate and a printed wiring board of sufficiently high reliability.

The invention claimed is:

1. A metal-clad laminate, comprising:
an insulating layer; and
a first metal layer that is present on one surface of the insulating layer, wherein:
the insulating layer is a laminate of at least a center layer, a first resin layer that is present on one surface of the center layer, and a second resin layer that is present on the other surface of the center layer,
the center layer contains a cured product of a resin composition and a fibrous base material,
the first resin layer and the second resin layer each contain a cured product of a resin composition and do not contain a fibrous base material,
the resin composition of the center layer is a resin composition that contains a thermosetting resin and that is different from the resin compositions of the first resin layer and the second resin layer, and
an elastic modulus of the cured product of the resin composition contained in the center layer, which is measured without the fibrous base material, is lower than elastic moduli of both the cured product of the resin composition contained in the first resin layer and the cured product of the resin composition contained in the second resin layer.

2. The metal-clad laminate according to claim 1, wherein the elastic modulus of the cured product of the resin composition contained in the first resin layer and the elastic modulus of the cured product of the resin composition contained in the second resin layer each range from 115 to 900% of the elastic modulus of the cured product of the resin composition contained in the center layer.

3. The metal-clad laminate according to claim 1, wherein the thickness of the first resin layer and the thickness of the second resin layer each range from 5 to 50% of the thickness of the center layer.

4. The metal-clad laminate according to claim 1, wherein the thicknesses of the first resin layer and the second resin layer each range from 1 to 25 μm.

5. The metal-clad laminate according to claim 1, wherein the thickness of the insulating layer ranges from 5 to 200 μm.

6. The metal-clad laminate according to claim 1, wherein the resin composition of the center layer contains a radical polymerizable thermosetting compound.

7. The metal-clad laminate according to claim 1, wherein the resin composition of the center layer is a liquid resin composition.

8. The metal-clad laminate according to claim 1, wherein the elastic modulus of the cured product of the resin composition contained in the first resin layer and the elastic modulus of the cured product of the resin composition contained in the second resin layer each range from 1 to 30 GPa at 25° C.

9. The metal-clad laminate according to claim 1, wherein a second metal layer is disposed on the other surface of the insulating layer.

10. A printed wiring board, which is obtained through formation of a circuit by partial removal of the first metal layer of the metal-clad laminate according to claim 1.

* * * * *